(12) United States Patent
Chatwin (10) Patent No.: US 8,149,980 B2
(45) Date of Patent: *Apr. 3, 2012

(54) SYSTEM AND METHOD FOR IMPLEMENTING A PHASE DETECTOR TO SUPPORT A DATA TRANSMISSION PROCEDURE

(75) Inventor: Jeremy Chatwin, Santa Cruz, CA (US)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/927,483

(22) Filed: Nov. 16, 2010

(65) Prior Publication Data

US 2011/0096884 A1  Apr. 28, 2011

Related U.S. Application Data

(63) Continuation of application No. 11/651,323, filed on Jan. 9, 2007, now Pat. No. 7,864,911.

(60) Provisional application No. 60/844,588, filed on Sep. 13, 2006.

(51) Int. Cl.
*H03D 3/24* (2006.01)

(52) U.S. Cl. .................... 375/375; 327/244

(58) Field of Classification Search ............ 375/371, 375/374–376; 327/141, 156, 158–159, 161, 327/236, 244
See application file for complete search history.

(56) References Cited

U.S. PATENT DOCUMENTS

| | | | | |
|---|---|---|---|---|
| 4,085,288 A * | 4/1978 | Viswanathan | ............... | 375/376 |
| 4,635,280 A * | 1/1987 | Smith et al. | ................. | 375/376 |
| 4,682,343 A * | 7/1987 | Pfiffner | ..................... | 375/295 |
| 4,847,874 A * | 7/1989 | Kroeger et al. | ............... | 375/360 |
| 5,090,026 A * | 2/1992 | Stern et al. | ................... | 375/274 |
| 5,452,333 A * | 9/1995 | Guo et al. | ..................... | 375/371 |
| 5,461,643 A * | 10/1995 | LaRosa et al. | ............... | 375/329 |
| 5,666,387 A * | 9/1997 | Tamamura et al. | ........... | 375/371 |
| 6,249,188 B1 * | 6/2001 | Kaneko | ........................... | 331/17 |
| 6,337,590 B1 * | 1/2002 | Millar | ........................... | 327/158 |
| 6,636,979 B1 * | 10/2003 | Reddy et al. | .................. | 713/503 |
| 6,727,738 B2 * | 4/2004 | Tsukikawa | ..................... | 327/160 |
| 6,756,822 B1 * | 6/2004 | Kaviani | ............................. | 327/3 |
| 6,838,918 B1 * | 1/2005 | Kaviani | ........................ | 327/160 |
| 6,838,919 B1 * | 1/2005 | Kaviani | ........................ | 327/172 |
| 6,927,611 B2 * | 8/2005 | Rhee et al. | ..................... | 327/149 |
| 6,937,685 B2 * | 8/2005 | Tang | .............................. | 375/376 |
| 6,943,597 B1 * | 9/2005 | Kaviani | ........................ | 327/145 |
| 7,042,252 B2 * | 5/2006 | Galloway et al. | ............... | 327/16 |
| 7,054,402 B2 * | 5/2006 | Muellner | ...................... | 375/355 |
| 7,123,678 B2 * | 10/2006 | Hendrickson | ................ | 375/376 |
| 7,173,995 B2 * | 2/2007 | Karlquist | ...................... | 375/376 |
| 7,236,026 B1 * | 6/2007 | Samad et al. | ................. | 327/156 |
| 7,437,137 B2 * | 10/2008 | Fiedler | .......................... | 455/317 |

* cited by examiner

*Primary Examiner* — Jean B Corrielus (74) *Attorney, Agent, or Firm* — Gregory J. Koerner; Redwood Patent Law (57) ABSTRACT

A system and method for effectively supporting a data transmission procedure includes a phase-locked loop with a phase detector that compares a clock signal and input data to generate a phase error signal for adjusting the clock signal that is generated from a voltage-controlled oscillator. The phase detector includes a positive-edge detector circuit that generates an edge detection signal P to indicate whether data transitions are present in the input data. The phase detector also includes a lead/lag indicator circuit that generates a lead/lag indicator signal T to indicate whether the clock signal is early or late with respect to the input data.

21 Claims, 9 Drawing Sheets

Phase Detector

Phase Detector

Fig. 8

| INPUTS | | OUTPUTS | |
|---|---|---|---|
| P | T | Up | Down |
| 0 | X | 0 | 0 |
| 1 | 0 | 0 | 1 |
| 1 | 1 | 1 | 0 |

Fig. 9

SYSTEM AND METHOD FOR IMPLEMENTING A PHASE DETECTOR TO SUPPORT A DATA TRANSMISSION PROCEDURE

CROSS-REFERENCE TO RELATED APPLICATIONS

This application is a continuation of U.S. patent application Ser. No. 11/651,323 entitled "System And Method For Effectively Implementing A Phase Detector To Support A Data Transmission Procedure," filed on Jan. 9, 2007, now U.S. Pat. No. 7,864,911, which claims priority of U.S. Provisional Patent Application No. 60/844,588 entitled "Gbps Transceiver Core Using A Tri-State Binary Phase Detector With 100 ps Gated Digital Output," filed on Sep. 13, 2006. The foregoing related Applications are commonly owned, and are hereby incorporated by reference.

BACKGROUND SECTION

1. Field of the Invention

This invention relates generally to techniques for transferring electronic information, and relates more particularly to a system and method for effectively implementing a phase detector to support a data transmission procedure.

2. Description of the Background Art

Implementing effective methods for transferring electronic information is a significant consideration for designers and manufacturers of contemporary electronic systems. However, effectively implementing data transfer systems may create substantial challenges for system designers. For example, enhanced demands for increased system functionality and performance may require more system processing power and require additional hardware resources. An increase in processing or hardware requirements may also result in a corresponding detrimental economic impact due to increased production costs and operational inefficiencies.

Furthermore, enhanced system capability to perform various advanced transfer operations may provide additional benefits to a system user, but may also place increased demands on the control and management of various system components. For example, an enhanced electronic system that effectively transfers digital image data may benefit from an effective implementation because of the large amount and complexity of the digital data involved.

Due to growing demands on system resources and substantially increasing data magnitudes, it is apparent that developing new techniques for implementing and utilizing data transfer systems is a matter of concern for related electronic technologies. Therefore, for all the foregoing reasons, developing effective systems for transferring electronic information remains a significant consideration for designers, manufacturers, and users of contemporary electronic systems.

SUMMARY

In accordance with the present invention, a system and method are disclosed for effectively implementing a phase detector to support a data transmission procedure. In accordance with one embodiment of the present invention, the phase detector evaluates phase error between a local clock signal and input data provided to a receiver device. The output of the phase detector may then by applied to adjust the clock signal to complete a closed feedback path of a phase-locked loop to thereby align the negative edge of the clock signal with data transitions in the input data. The positive edge of the clock signal is then optimally positioned to sample input data in the center of respective data pulses.

For certain types of input data, phase information is only present during data transitions. Long strings of transmitted "1" or "0" symbols are devoid of data transitions, and therefore impart no phase information to the receiver. The present invention successfully addresses these periods without data transitions by providing a tri-state output so that the phase detector only outputs clock phase-adjustment information during input data transitions.

In certain embodiments, the phase detector comprises an input circuit, a lead/lag indicator circuit, a positive-edge detector circuit, and an up/down selector circuit. In one embodiment, the input circuit includes a D flip-flop A, a first inverter, and a D flip-flop B, and the lead/lag indicator circuit includes a D flip-flop D. In addition, the positive-edge detector circuit includes a D flip-flop C, a second inverter, and an edge detector gate A, and the up/down selector circuit includes an up gate B, a third inverter, and a down gate C.

In one embodiment, the phase detector initially receives a signal D (input data) from an interface of the receiver or from any other appropriate data source. The input data is provided to data inputs of both D flip-flop A and D flip-flop B. In addition, the phase detector receives a clock signal via a feedback loop from a voltage-controlled oscillator of the phase-locked loop. The clock signal is provided to the clock input of D flip-flop A. The clock signal is also inverted by the first inverter, and then is provided to the clock input of D flip-flop B.

In response to the rising edge of the clock signal, D flip-flop A generates a retimed data signal B. In response to the rising edge of the inverted clock signal, D flip-flop B generates a retimed data signal C. In the present embodiment, the retimed data signal C is provided to the data input of D flip-flop D, and the retimed data signal B is provided to the clock input of D flip-flop D. In response, D flip-flop D generates a clock lead/lag indicator signal T that has two possible states to indicate the current phase relationship (clock early or clock late) between the input data and the clock signal.

In the present embodiment, retimed data signal B is provided to the data input of D flip-flop C, and the clock signal is provided to the clock input of D flip-flop C. In response, D flip-flop C outputs a delay signal A that is then inverted by the second inverter before being applied to a first input of edge detector gate A. The retimed data signal B is also provided to a second input of the edge-detector gate A. In the present embodiment, edge detector gate A, up gate B, and down gate C are all implemented as AND gates. In accordance with the present invention, edge detector gate A responsively outputs an edge detection signal P that indicates whether the input data currently contains valid phase information in the form of data transitions.

In the present embodiment, edge detection signal P is applied to first inputs of both up gate B and down gate C. In addition, up gate B receives lead/lag indicator signal T on a second input. In response, up gate B outputs an up signal for potentially adjusting (when active) the clock signal. Furthermore, lead/lag indicator signal T is inverted by the third inverter, and is then provided to a second input of down gate C. In response, down gate C outputs a down signal for potentially adjusting (when active) the clock signal. For at least the foregoing reasons, the present invention therefore provides an improved system and method for effectively implementing a phase detector to support a data transmission procedure.

DETAILED DESCRIPTION

The present invention relates to an improvement in data transmission systems. The following description is presented to enable one of ordinary skill in the art to make and use the invention, and is provided in the context of a patent application and its requirements. Various modifications to the disclosed embodiments will be readily apparent to those skilled in the art, and the generic principles herein may be applied to other embodiments. Thus, the present invention is not intended to be limited to the embodiments shown, but is to be accorded the widest scope consistent with the principles and features described herein.

The present invention is described herein as a system and method for effectively supporting a data transmission procedure, and includes a phase-locked loop with a phase detector that compares a clock signal and input data to generate a phase error signal for adjusting the clock signal that is generated from a voltage-controlled oscillator. The phase detector includes a positive-edge detector circuit that generates an edge detection signal P to indicate whether data transitions are present in the input data. The phase detector also includes a lead/lag indicator circuit that generates a lead/lag indicator signal T to indicate whether the clock signal is early or late with respect to the input data.

Figure 1:
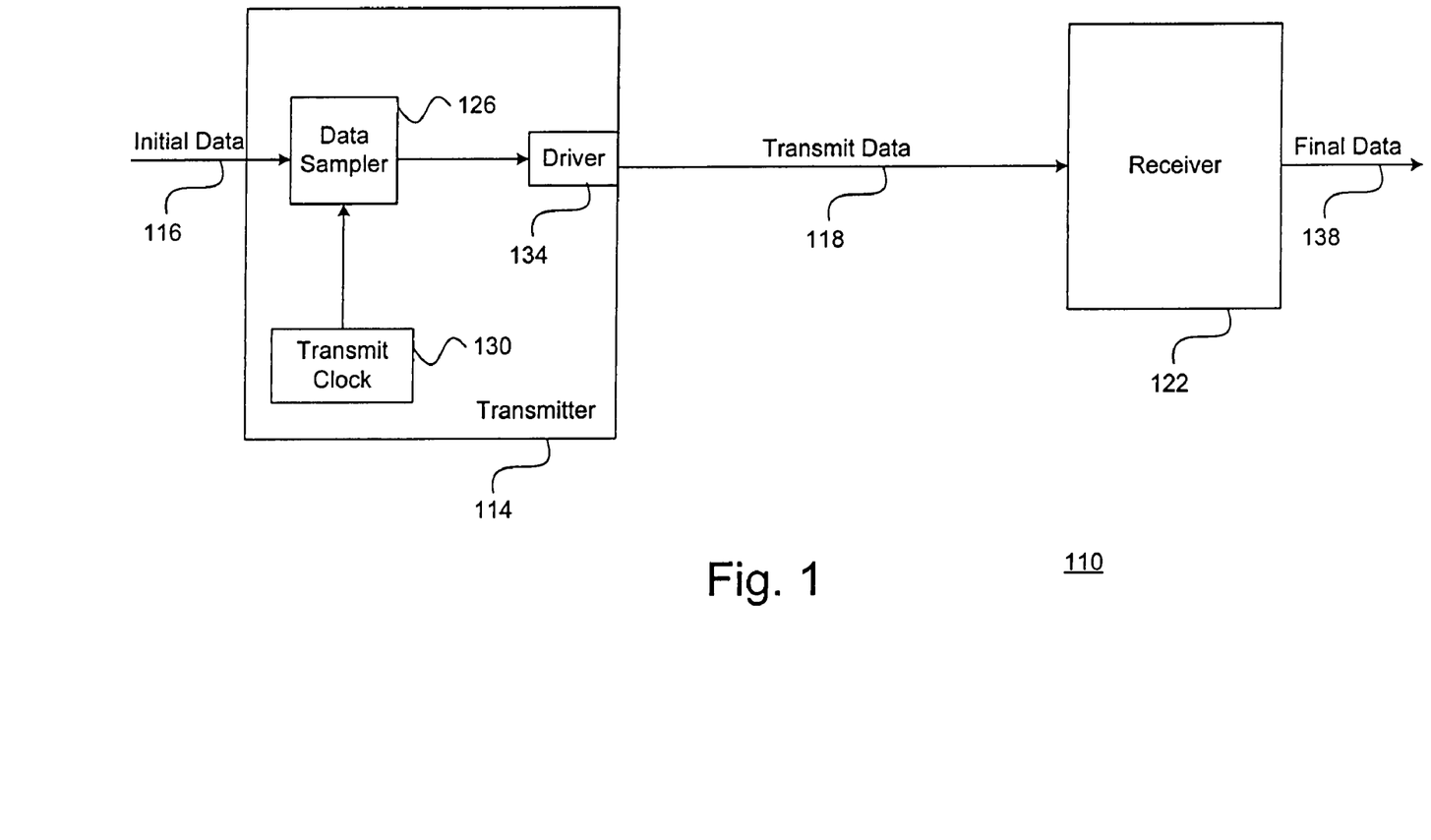
FIG. 1 is a block diagram of a data transmission system, in accordance with one embodiment of the present invention.

Referring now to FIG. 1, a block diagram of a data transmission system 110 is shown, in accordance with one embodiment of the present invention. In the FIG. 1 embodiment, data transmission system 110 includes, but is not limited to, a transmitter 114 and a receiver 122. In alternate embodiments, data transmission system 110 may be implemented using components and configurations in addition to, or instead of, certain of those components and configurations discussed in conjunction with the FIG. 1 embodiment.

In the FIG. 1 embodiment of data transmission system 110, a transmitter 114 utilizes a data sampler 126 to receive initial data 116 from any appropriate data source. Data sampler 126 synchronizes the initial data 116 with reference to a transmit clock 130. A driver 134 then outputs the synchronized initial data 116 over any appropriate type of transmission channel as transmit data 118. A receiver 122 of data transmission system 110 may then receive and process the transmit data 118 to thereby provide final data 138 to any appropriate data destination.

Data transmission system 110 therefore may transfer any desired type of electronic data or information between two separate locations via a transmission channel. These locations may be considerably distant (for example, between continents or between satellites), or may alternately be relatively close to each other (for example, between devices inside electronic equipment). A wide range of physical transmission media may be used to facilitate this transmission. Examples include electro-magnetic waves in free space (wireless transmission), or electro-magnetic waves in a constrained media (optical fiber, waveguides, cables, etc.).

This transmit data 118 is typically processed into a format that is suitable for transmission across the channel in a manner that maximizes intelligibility (a low incidence of error at the receiver 122, that has a low bit-error rate (BER), that maximizes the data throughput rate (measured in bits/second or symbols/second), and that minimizes certain cost factors such as transmission power, implementation complexity, and maximize spectral efficiency.

One method of processing involves serializing the initial data 116 before transmission, so that each data bit is represented by a unique symbol. These symbols are transmitted across the channel at a particular rate, controlled by transmit clock 130 of transmitter 114. Various symbols may be chosen to encode the transmit data 118. Examples of such encoding techniques include Manchester bi-phase, Return-to-Zero (RZ), and Non-Return-to-Zero (NRZ), etc. Of the binary encoding techniques, NRZ is more spectrally efficient because, for a given channel capacity, it allows the maximum data rate.

To accurately receive and de-serialize these encoded symbols with a low BER, the receiver 122 may regenerate a local receiver clock that is similar to the transmit clock 130 of transmitter 114 with respect to frequency and phase. This synchronization of the receiver clock to the frequency and phase of incoming transmit data 118 may be advantageously performed by either a Phase Locked Loop (PLL) device or a Delay Locked Loop (DLL) device during a clock regeneration procedure. Further details regarding the implementation and utilization of receiver 122 are further discussed below in conjunction with FIGS. 2-9.

Figure 2:
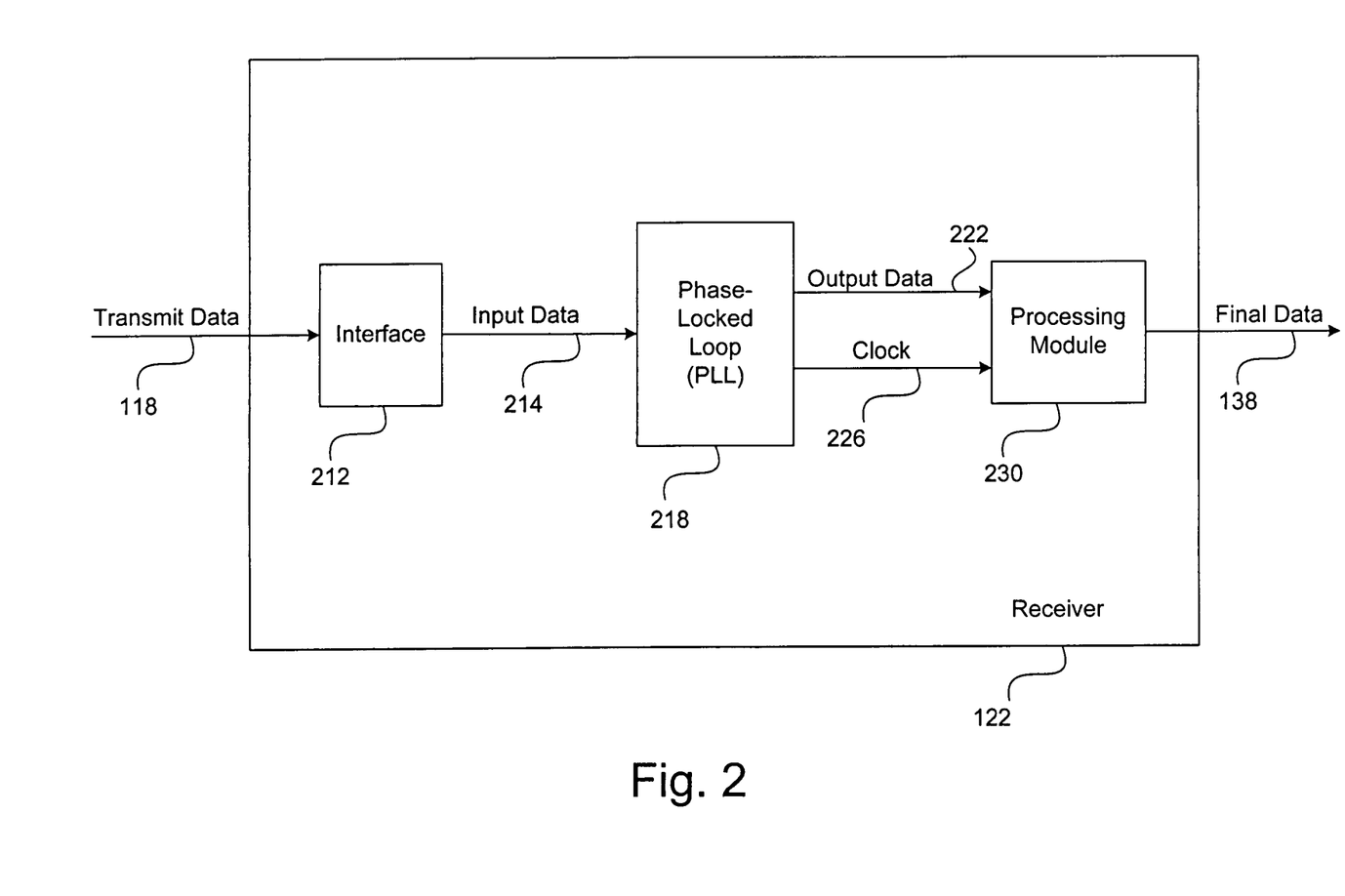
FIG. 2 is a block diagram for one embodiment of the receiver of FIG. 1, in accordance with the present invention.

Referring now to FIG. 2, a block diagram for one embodiment of the FIG. 1 receiver 122 is shown, in accordance with the present invention. In the FIG. 2 embodiment, receiver 122 may include, but is not limited to, an interface 212, a phase-locked loop (PLL) 218, and a processing module 230. In alternate embodiments, receiver 122 may be implemented using components and configurations in addition to, or instead of, certain of those components and configurations discussed in conjunction with the FIG. 2 embodiment. In various embodiments, receiver 122 may be implemented as any other appropriate type of electronic device.

In the FIG. 2 embodiment, transmit data 118 may be received from any desired data source, and may be encoded in any appropriate data format. For example, in certain embodiments, transmit data 118 may be received from a transmitter 114 of a data transmission system 110 (FIG. 1). In the FIG. 2 embodiment, an interface 212 of receiver 122 converts transmit data 118 into corresponding input data 214. In certain embodiments, input data 214 may be encoded according to an NRZ encoding technique.

In the FIG. 2 embodiment, a phase-locked loop (PLL) 218 receives input data 214, and responsively performs a clock regeneration procedure to produce a clock signal 226. A processing module 230 may receive output data 222 and clock 226 for performing any appropriate processing procedures to thereby produce final data 138. In certain embodiments, PLL 218 may alternately be implemented as a delay-locked loop (DLL) that is further discussed below in conjunction with FIG. 6. Certain additional details for the implementation and utilization of PLL 218 are further discussed below in conjunction with FIGS. 3-5 and FIGS. 7-9.

Figure 3:
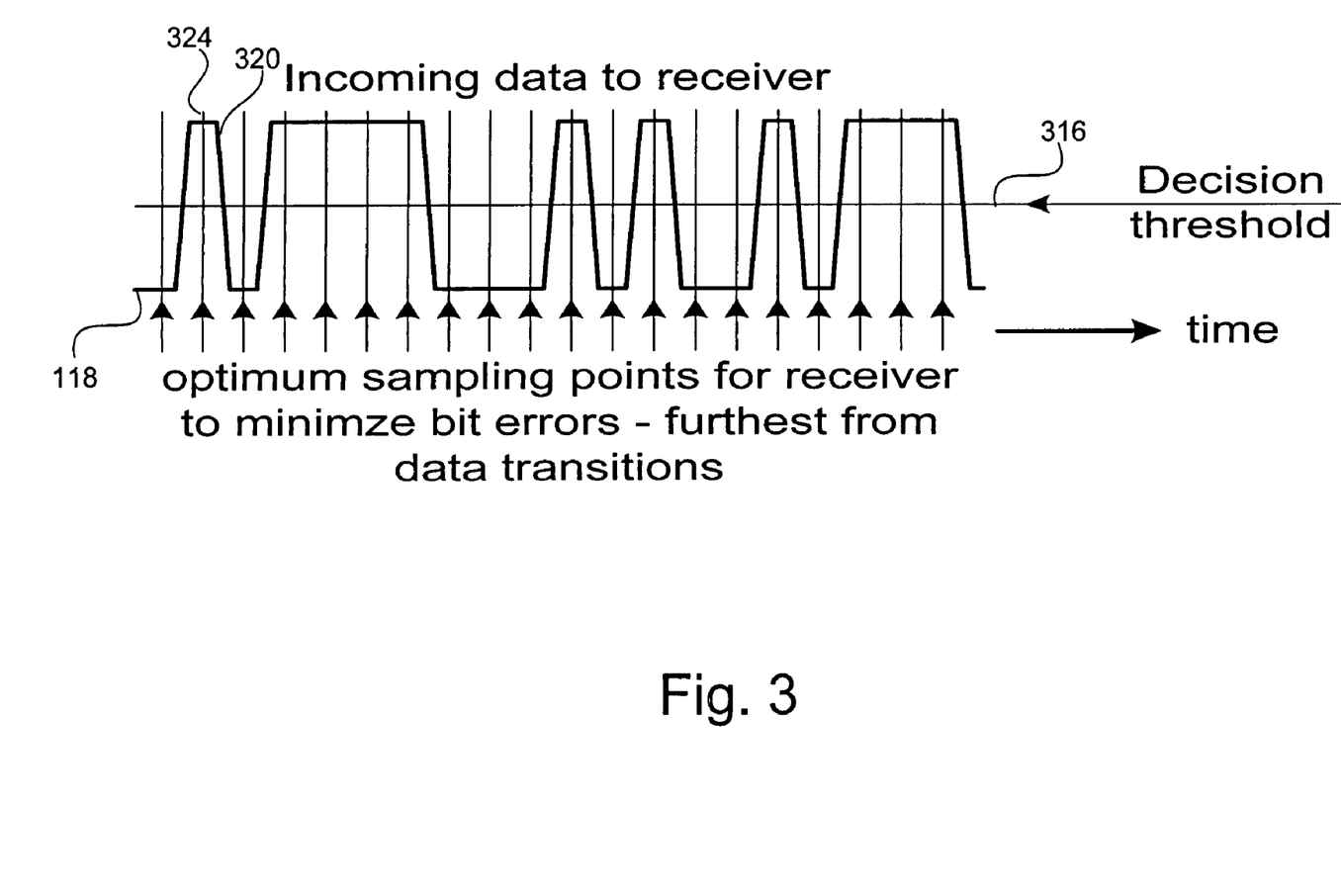
FIG. 3 is a diagram illustrating optimum data sampling points, in accordance with one embodiment of the present invention.

Referring now to FIG. 3, a diagram illustrating optimum data sampling points is shown, in accordance with one embodiment of the present invention. The FIG. 3 diagram is presented for purposes of illustration, and in alternate embodiments, the present invention may utilize techniques and timing relationships in addition to, or instead of, certain of those techniques and timing relationships discussed in conjunction with the FIG. 3 embodiment.

In the FIG. 3 embodiment, exemplary pulses of incoming data 118 to receiver 122 (FIG. 1) are shown. A decision threshold 316 for determining either a high or low state for incoming data 118 is also shown. The FIG. 3 embodiment also shows a sequence of optimal sampling points for receiver 122 to read the current state of the pulses of incoming data 118. For example, the FIG. 3 diagram shows a first pulse 320 of incoming data 118 aligned with a corresponding optimum sampling point that occurs at time 324.

Because of various potential types of noise, transition edge skewing, jitter, and other signal artifacts on the rising or falling transitions of incoming data 118, receiver 122 requires a regenerated clock 226 that aligns incoming data 118 so that the data sampling points occur during the middle of the corresponding data pulses (away from the respective transition edges). To accurately determine the clock phase error, receiver 122 must make a decision regarding the temporal position of an incoming data transition with respect to the receiver local clock 226.

Therefore, receiver 122 defines one or more decision thresholds 316, and when the incoming data 118 crosses decision threshold 316, receiver 122 is able to determine phase information. Receiver 122 may thus align the receiver local clock 226 (FIG. 2) to the optimum time position with respect to the incoming data 118. The receiver local clock 226 is then able to sample the incoming data 118, and then using the same or another decision threshold 316, make a determination as to the state of the received bits. The FIG. 3 diagram illustrates the relationship between the incoming data 118 and the optimum sampling points aligned with the regenerated phase-locked clock 226 of receiver 122. As discussed above, the optimum sampling points are in the center of the pulses of the incoming data 118. In other words, the optimum sampling points are at locations furthest from the adjacent data transitions.

Figure 4:
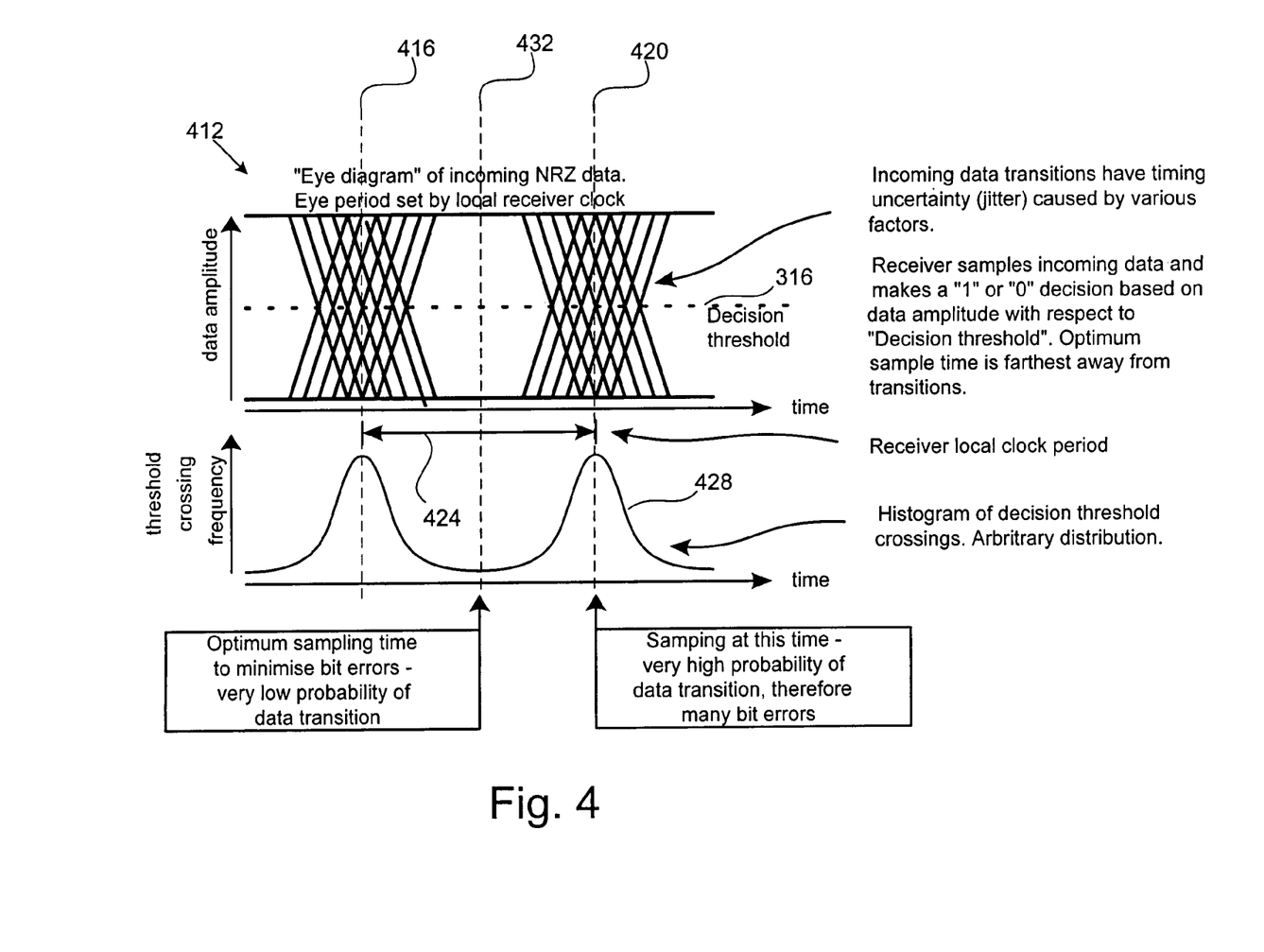
FIG. 4 is an eye diagram and corresponding histogram, in accordance with one embodiment of the present invention.

Referring now to FIG. 4, an eye diagram 412 and corresponding histogram 428 are shown to illustrate optimal clock timing characteristics, in accordance with one embodiment of the present invention. The FIG. 4 eye diagram 412 and histogram 428 are presented for purposes of illustration. In alternate embodiments, the present invention may utilize techniques and timing relationships in addition to, or instead of, certain of those techniques and timing relationships discussed in conjunction with the FIG. 4 embodiment.

The incoming data 118 to the receiver 122 (FIG. 1) exhibits variations in bit width over time. Such variation is termed jitter. Jitter includes a random component caused, for example, by noise at the transmitter 114 and/or in the environment. Jitter also includes a deterministic component caused, for example, by attenuation and bandwidth-limiting in the transmission channel and/or interference from other sources. The presence of jitter causes the incoming data transitions to move temporally with respect to the receiver local clock 226.

If the jitter is too great, or if the receiver clock 226 is poorly phase-aligned to the incoming data 118, then bit errors may likely increase in the receiver 122 as the receiver clock 226 samples closer to data transitions with a higher probability of making an error in the bit state determination. This phenomenon is demonstrated in FIG. 4. Eye diagram 412 is a plot of the incoming data 118, after being divided into segments corresponding to individual bit periods, each of the segments then being superimposed over the other segments in an eye diagram 412.

The eye region shown between time 416 and time 420, shows multiple superimposed data transitions, and how the transitions vary in time from a single ideal transition due to factors such as jitter. In the FIG. 4 embodiment, histogram 428 shows data transition frequency versus time. As shown in histogram 428, if receiver 122 samples close to the peaks of the histogram 428, then there is a higher probability that receiver 122 will make an erroneous bit-state determination. Therefore, the optimum sampling point is located at time 432 which is midway between the histogram peaks shown at times 416 and 420. In accordance with the present invention, accurately regenerating a local clock 226 allows receiver 122 to position optimum sampling points at time 432 to thereby advantageously tolerate a greater amount of jitter at a particular error rate.

Figure 5:
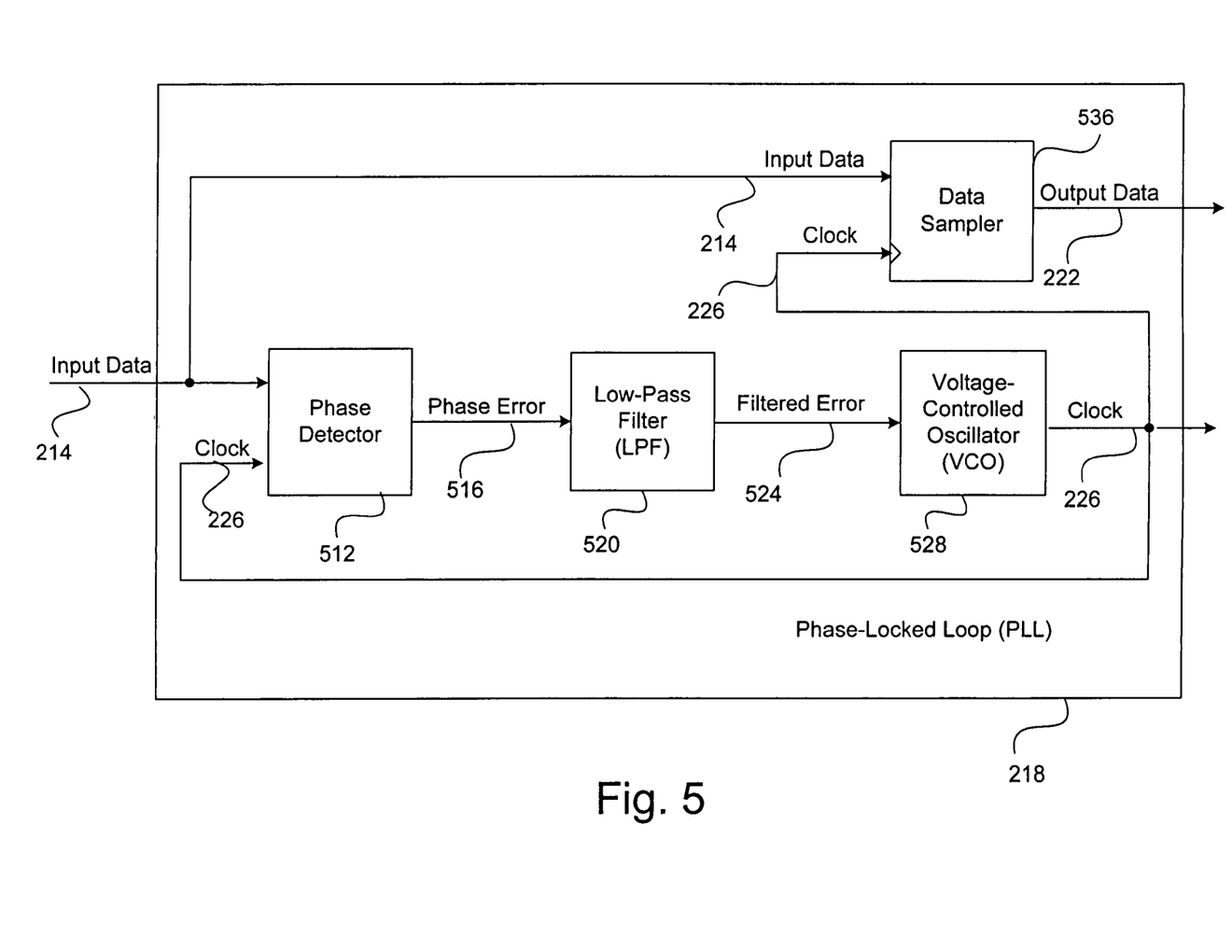
FIG. 5 is a block diagram for one embodiment of the phase-locked loop from FIG. 2, in accordance with the present invention.

Referring now to FIG. 5, a block diagram for one embodiment of the FIG. 2 phase-locked loop (PLL) 218 is shown, in accordance with the present invention. In the FIG. 5 embodiment, PLL 218 may include, but is not limited to, a phase detector 512, a low-pass filter (LPF) 520, a voltage-controlled oscillator (VCO) 528, and a data sampler 536. In alternate embodiments, PLL 218 may be implemented using components and configurations in addition to, or instead of, certain of those components and configurations discussed in conjunction with the FIG. 5 embodiment.

In the FIG. 5 embodiment, PLL 218 performs a clock regeneration procedure to regenerate a clock signal 226 for synchronizing and outputting input data 214 from a data sampler 536 as output data 222. In the FIG. 5 embodiment, a phase detector 512 initially receives input data 214 from a receiver interface 212 (FIG. 2) or any other appropriate data source. The input data 214 is also provided to a data input of the data sampler 536. The phase detector 512 also receives the regenerated clock signal 226 via a feedback loop from a voltage-controller oscillator (VCO) 528. In response, phase detector 512 compares the current phase relationship of input data 214 and clock 226, and responsively outputs a phase error signal 516 that represents the current phase relationship between input data 214 and the clock signal 226.

In the FIG. 5 embodiment, a low-pass filter (LPF) 520 may next perform a filtering operation to remove higher-frequency components of phase error 516 to thereby generate a filtered error signal 524. In the FIG. 5 embodiment, VCO 528 then utilizes the filtered error signal 524 to dynamically control/adjust its internal operating frequency to regenerate clock signal 226 with optimal timing characteristics. The regenerated clock 226 may then be provided to phase detector 512, data sampler 226, and any other downstream components.

In the FIG. 5 embodiment, data sampler 536 may be implemented as any appropriate electronic device. For example, in certain embodiments, data sampler 536 is implemented as a D-flip flop device that utilizes the rising edge of clock 226 to gate input data 214 through as output data 222 to any desired downstream destination. The implementation and utilization of phase detector 512 is further discussed below in conjunction with FIGS. 7-9.

Figure 6:
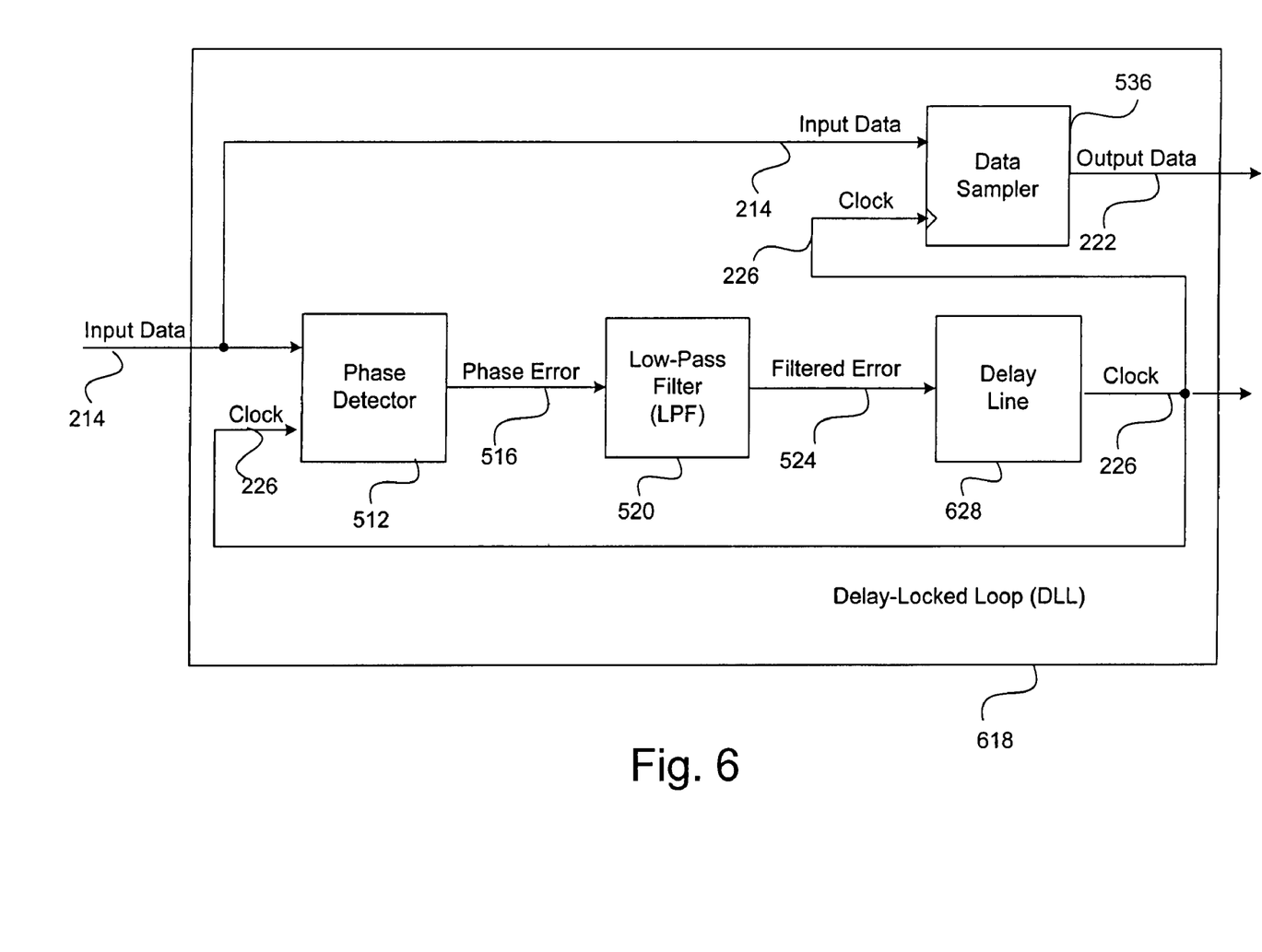
FIG. 6 is a block diagram for one embodiment of a delay-locked loop, in accordance with the present invention.

Referring now to FIG. 6, a block diagram of a delay-locked loop (DLL) 618 is shown, in accordance with one embodiment of the present invention. In the FIG. 6 embodiment, DLL 618 may include, but is not limited to, a phase detector 512, a low-pass filter (LPF) 520, a delay line 628, and a data sampler 536. In alternate embodiments, DLL 618 may be implemented using components and configurations in addition to, or instead of, certain of those components and configurations discussed in conjunction with the FIG. 6 embodiment. In accordance with certain embodiments of the present invention, the FIG. 2 receiver 122 may alternately be implemented by utilizing DLL 618 instead of the PLL 218 shown in FIG. 2.

In the FIG. 6 embodiment, DLL 618 performs a clock regeneration procedure to regenerate a clock signal 226 for synchronizing and outputting input data 214 from a data sampler 536 as output data 222. In the FIG. 6 embodiment, a phase detector 512 initially receives input data 214 from a receiver interface 212 (FIG. 2) or any other appropriate data source. The input data 214 is also provided to a data input of the data sampler 536. The phase detector 512 also receives the regenerated clock signal 226 via a feedback loop from a delay line 628. In response, phase detector 512 compares the current phase relationship of input data 214 and clock 226, and responsively outputs a phase error signal 516 that represents the current phase relationship between input data 214 and the clock signal 226.

In the FIG. 6 embodiment, a low-pass filter (LPF) 520 may next perform a filtering operation to remove higher-frequency components of phase error 516 to thereby generate a filtered error signal 524. In the FIG. 6 embodiment, delay line 628 then utilizes the filtered error signal 524 to dynamically control/adjust the signal phase characteristics of an internal delay line clock to regenerate clock signal 226 with optimal timing characteristics. The regenerated clock 226 may then be provided to phase detector 512, data sampler 226, and any other downstream components.

In the FIG. 6 embodiment, data sampler 536 may be implemented as any appropriate electronic device. For example, in certain embodiments, data sampler 536 is implemented as a D-flip flop device that utilizes the rising edge of clock 226 to gate input data 214 through as output data 222 to any desired downstream destination. The implementation and utilization of phase detector 512 is further discussed below in conjunction with FIGS. 7-9.

Figure 7:
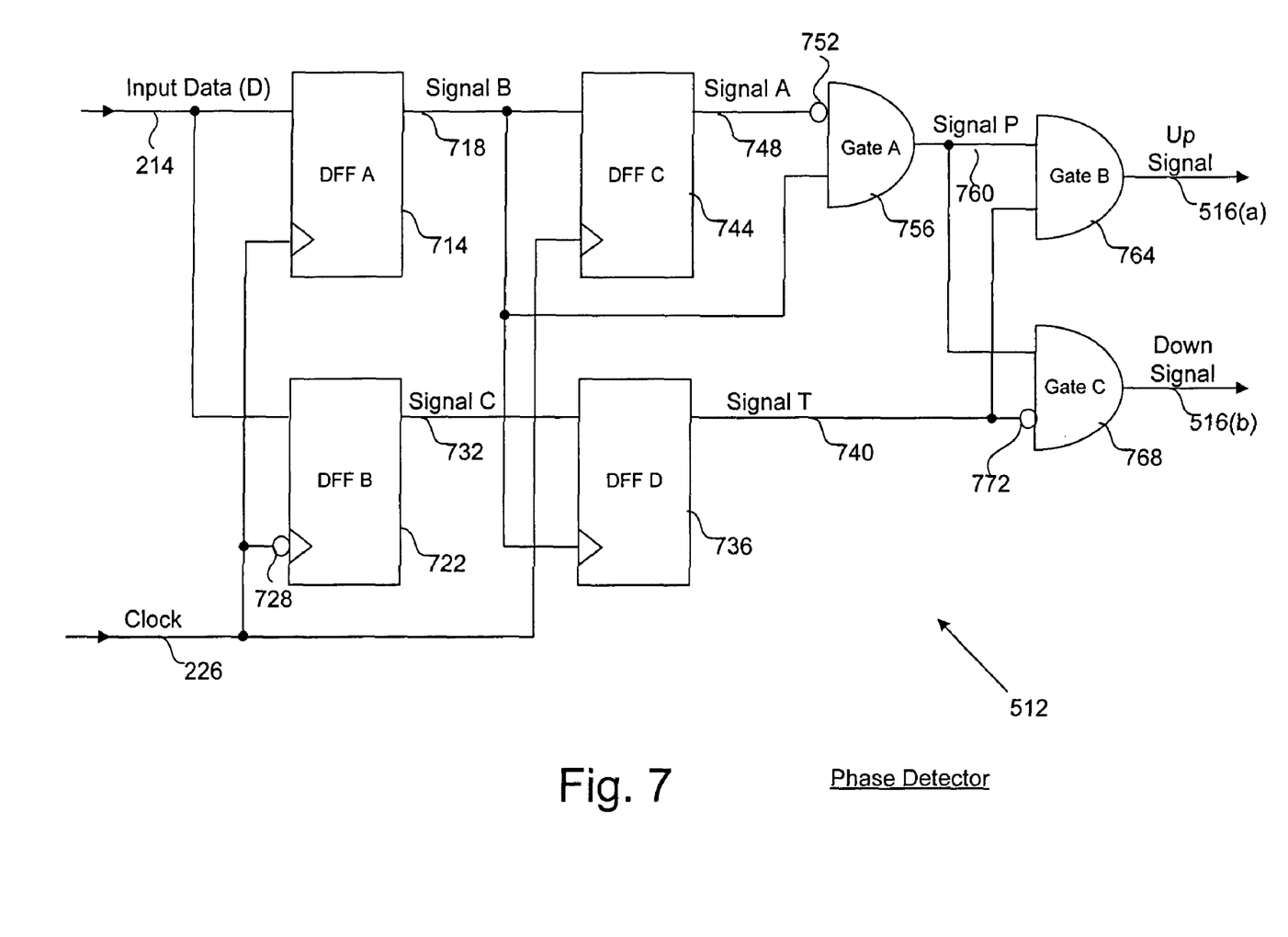
FIG. 7 is a schematic diagram for one embodiment of the phase detector of FIGS. 5 and 6, in accordance with the present invention.

Referring now to FIG. 7, a schematic diagram for one embodiment of the phase detector 512 of FIGS. 5 and 6 is shown, in accordance with the present invention. In alternate embodiments, phase detector 512 may be implemented using components and configurations in addition to, or instead of, certain of those components and configurations discussed in conjunction with the FIG. 7 embodiment.

A key element of both the FIG. 5 PLL 218 and the FIG. 6 DLL 618 is phase detector 512. Phase detector 512 evaluates the phase error between the clock signal 226 and the input data 214. The output of phase detector 516 is then processed by LPF 524 (FIG. 5) before being applied to adjust the local receiver clock 226 to complete a closed feedback loop to align the negative edge of clock 226 with data transitions. The positive edge of clock 226 is then optimally positioned to sample input data 214 in the center of respective data pulses. The feedback loop thus operates to minimize the phase error between the local receiver clock 226 and input data 214 to achieve a state of optimal synchronization.

Various methods exist for the detection of phase error. Broadly speaking, they may be grouped into two types: binary and analog types. The analog types have an output characteristic that is continuous over some finite range of input phase error. Conventional binary types of phase detectors do not have a continuous characteristic. Their output has two states indicating the polarity of incoming phase error (early or late). Typical implementations of binary phase detectors also re-time the input data, and so will automatically align the PLL or DLL to sample the data in the middle of the data eye. Therefore a well designed binary PD has very low static phase-error offsets and automatically aligns the receiver clock source to the optimum data symbol sampling point. In the FIG. 7 embodiment, phase detector 512 is implemented as a binary type of phase detector with certain improvements.

For certain types of input data, phase information is only present during a data transition. Therefore long strings of transmitted "1" or "0" symbols are devoid of transitions and therefore impart no phase information to the receiver 122. The present invention successfully addresses these periods without data transitions by providing a tristate output so that phase detector 512 only outputs phase adjustment information during input data transitions.

In the FIG. 7 embodiment, phase detector 512 comprises an input circuit that includes a D flip-flop A (DFF A) 714, an inverter 728, and a D flip-flop B (DFF B) 722. The FIG. 7 embodiment also comprises a lead/lag indicator circuit that includes a D flip-flop D (DFF D) 736. In addition, the FIG. 7 phase detector 512 comprises a positive-edge detector circuit that includes a D flip-flop C (DFF C) 744, an inverter 752, and an edge detector gate A 756. Furthermore, phase detector 512 comprises an up/down selector circuit that includes an up gate B 764, an inverter 772, and a down gate C 768.

In the operation of the FIG. 7 embodiment, phase detector 512 initially receives a signal D (input data) 214 from an interface 212 of receiver 122 or from any other appropriate data source. The input data 214 is provided to data inputs of both DFF A 714 and DFF B 722. In addition, phase detector 512 receives a regenerated clock signal 226 via a feedback loop from a voltage-controlled oscillator 528 of PLL 218 (FIG. 5). The clock signal 226 is provided to the clock input of DFF A 714. The clock signal 226 is also inverted by inverter 728 and provided to the clock input of DFF B 722. In response to rising edge of clock 226, DFF A 714 generates a retimed data signal B 718. In response to the rising edge of inverted clock 226, DFF B 722 generates a retimed data signal C 732.

In the FIG. 7 embodiment, signal C is provided to the data input of DFF D 736, and signal B 718 is provided to drive the clock input of DFF D 736. In response, DFF D 736 generates a clock lead/lag indicator signal T 740 that has two possible states to indicate the current phase relationship (clock early or clock late) between input data 214 and clock 226. For example, in the FIG. 7 embodiment, when clock signal 226 leads input data 214, then signal T 740 exhibits a low state, and when clock signal 226 lags input data 214, then signal T 740 exhibits a high state.

In the FIG. 7 embodiment, signal B 718 is provided to the data input of DFF C 744, and the regenerated clock signal 226 is provided to the clock input of DFF C 744. In response, DFF C 744 outputs a delay signal A 748 that is then inverted by inverter 752 before being applied to a first input of edge detector gate A 756. Signal B 718 is also provided to a second input of edge-detector gate A 756. In the FIG. 7 embodiment, gate A 756, gate B 764, and gate C 768 are all implemented as AND gates. In accordance with the present invention, gate A 756 responsively outputs an edge detection signal P 760 that indicates whether input data 214 currently contains phase information in the form of data transitions. For example, in the FIG. 7 embodiment, signal P 760 is high when data transitions are present in input data 214. Alternately, signal P 760 is low when no data transitions are present in input data 214.

In the FIG. 7 embodiment, signal P 760 is applied to first inputs of both up gate B 764 and down gate C 768. In addition, up gate B 764 receives signal T 740 on a second input. In response, up gate B 764 outputs an up signal 516(a) for potentially adjusting (when active) the frequency of the voltage-controlled oscillator 528 (FIG. 5). Furthermore, signal T 740 is inverted by inverter 772 and provided to a second input of down gate C 768. In response, down gate C 768 outputs an down signal 516(b) for potentially adjusting (when active) the frequency of the voltage-controlled oscillator 528. An output truth table for the up/down selector circuit of phase detector 512 is further discussed below in conjunction with FIG. 9.

In certain embodiments, when either up signal 516(a) or down signal 516(b) are active, they may be alternately switched to charge (up) or discharge (down) a capacitor connected to the input of VCO 528 (FIG. 5) to thereby increase or decrease the frequency of regenerated clock signal 226. In addition, in certain embodiments, instead of utilizing separate up signals and down signals, the frequency of VCO 528 may be controlled by a polarity signal to indicate whether clock 226 is early or late with respect to input data 214, and an enable signal to indicate the presence of valid data transitions in input data 214. In the FIG. 7 embodiment, signal T 740 may be utilized as the foregoing polarity signal, and signal P 760 may be utilized as the foregoing enable signal.

In the FIG. 5 embodiment, PLL 218 includes a separate data sampler circuit 536. Similarly, in the FIG. 6 embodiment, DLL 618 includes a separate data sampler 536 circuit. In certain embodiments, because the input data, clock signal, and output data are the same or sufficiently similar, the present invention may be economically implemented by utilizing the output of DFF A 714 (signal B 718) or the output of DFF C 744 (signal A 748) as output data 222 of either PLL 218 or DLL 618. A separate data sampler circuit 536 is therefore not required.

In the FIG. 7 embodiment, gate A 756, gate B 764, and gate C 768 are implemented as AND gates. However, in conventional AND gates, signal paths from respective inputs to the output may have different propagation delay characteristics. These unmatched data paths may result in differing pulse widths for up signal 516(a) and down signal 516(b). The FIG. 7 phase detector 512 is therefore advantageously implemented with AND gates that have symmetrical input-output data paths with substantially matching propagation delays for each gate input to the corresponding gate output.

Furthermore, in the FIG. 7 embodiment, edge detector gate A 756 is advantageously implemented as a simple AND gate, as opposed to another type of gate, because certain other types of gates (such as exclusive-OR gates) consume significantly more operating power and have more costly and unnecessarily-complex architectures. In addition, edge detector gate A 756 detects transitions only on the rising edge of input data 214 because variations in pulse widths of input data 214 may otherwise result in edge detection errors if both rising and falling transitions were detected.

In the FIG. 7 embodiment, the output pulses of phase detector 512 (up signal 516(a) and down signal 516(b)) advantageously exhibit stable pulse-shape characteristics because only two signals (signal B 718 and signal A 748) are utilized by edge detector gate A 756 to generate signal P 760. In the embodiments of FIGS. 1-7, the present invention is disclosed and discussed as being implemented primarily as hardware circuitry. However, in alternate embodiments, certain of the functions of the present invention may be performed by appropriate software instructions that are executed for performing functions that are equivalent to those functions of the hardware circuitry discussed herein. The operation of phase detector 512 is further discussed below in conjunction with FIGS. 8-9.

Figure 8:
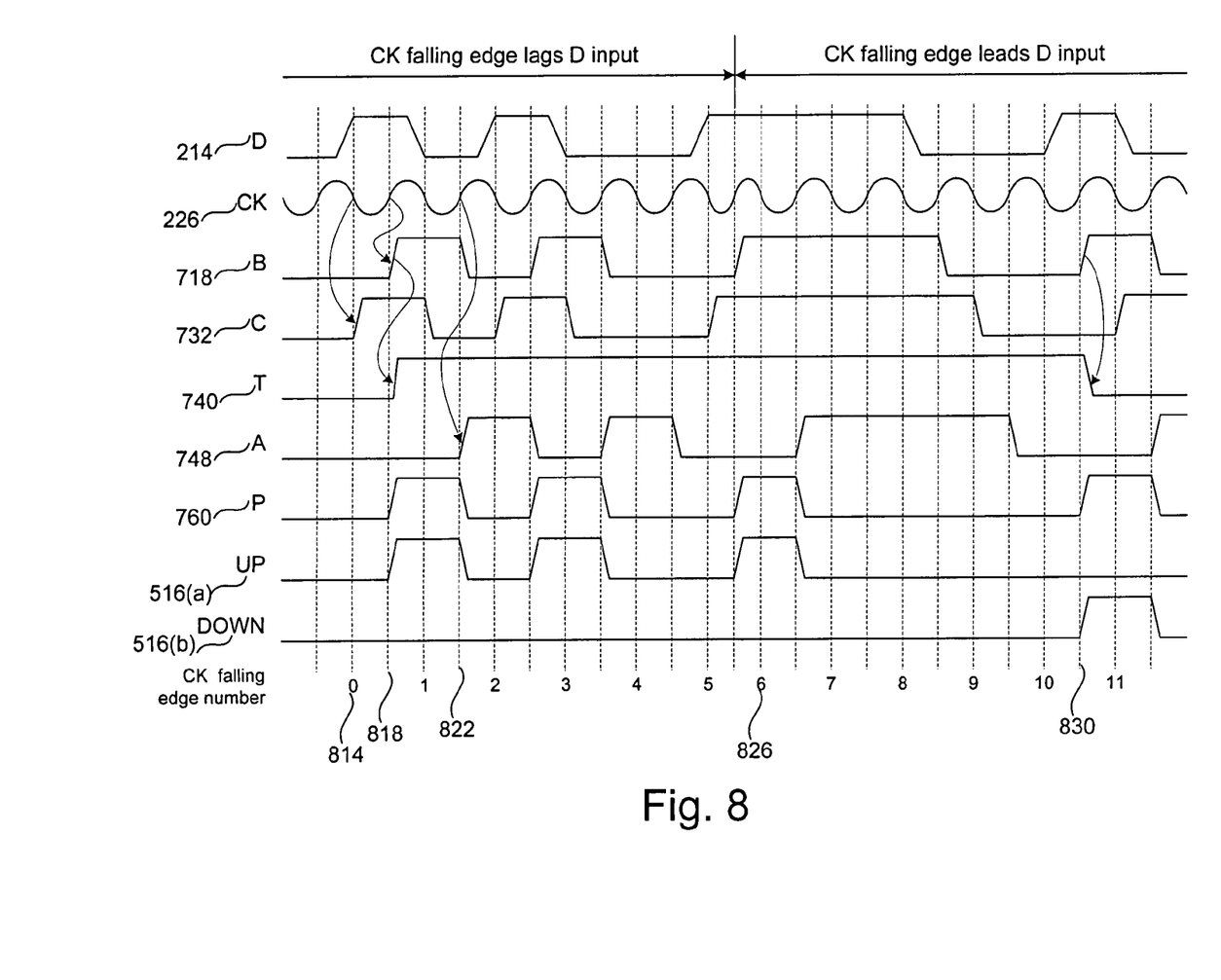
FIG. 8 is an exemplary waveform timing diagram for the phase detector of FIG. 7, in accordance with one embodiment of the present invention.

Referring now to FIG. 8, an exemplary waveform timing diagram for the FIG. 7 phase detector 512 is shown, in accordance with one embodiment of the present invention. The FIG. 8 waveforms are presented for purposes of illustration. In alternate embodiments, phase detector 512 may readily utilize waveforms, timing relationships, and functionalities, in addition to, or instead of, certain of those waveforms, timing relationships, and functionalities discussed in conjunction with the FIG. 8 embodiment.

In the FIG. 8 embodiment, the waveform timing diagram includes a signal D (input data) 214, a clock signal (CK) 226, a B signal 718, a C signal 732, a T signal 740, an A signal 748, a P signal 760, an up signal 516(a), and a down signal 516(b). The FIG. 8 diagram also includes a series of clock (CK) 226 falling edge numbers 0 through 11. In the FIG. 8 diagram, signal B 718 and signal C 732 are re-timed copies of the D input 214. Signal B 718 is re-timed from the rising edge of CK 226, and signal C 732 is re-timed from the falling edge of CK 226.

In the FIG. 8 diagram, when the falling edge of CK 226 lags the D input 214, then signal C 732 leads signal B 718. However, when the falling edge of CK 226 leads the D input 214, then signal C 732 lags signal B 718. The rising edge of signal B 718 re-times signal C 732. Therefore, when signal C 732 leads signal B 718, then signal T 740 is high, and when signal C 732 lags signal B 718, then signal T 740 is low. Signal T 740 is thus a lead/lag indicator with respect to the phase relationship of input data D 214 and clock (CK) 226.

Valid phase information is available only after a rising transition of D input signal 214. At the falling edge number 6 of CK 226, the CK phase changes, but the T signal 740 does not change state to indicate this condition until after the edge number 10 of CK 226. Therefore, between CK edge 6 and 10 the phase information of signal T 740 is inaccurate. The rising edge-detector output P 760 indicates when a valid rising D edge has occurred, and is used to gate the T signal 740. The up signal 516(a) and the down signal 516(b) thus accurately output phase error information only after a valid transition of D signal 214. The present invention therefore utilizes the FIG. 7 embodiment to effectively provide accurate output information even when input data D 214 fails to contain adequate data transition information.

Figure 9:
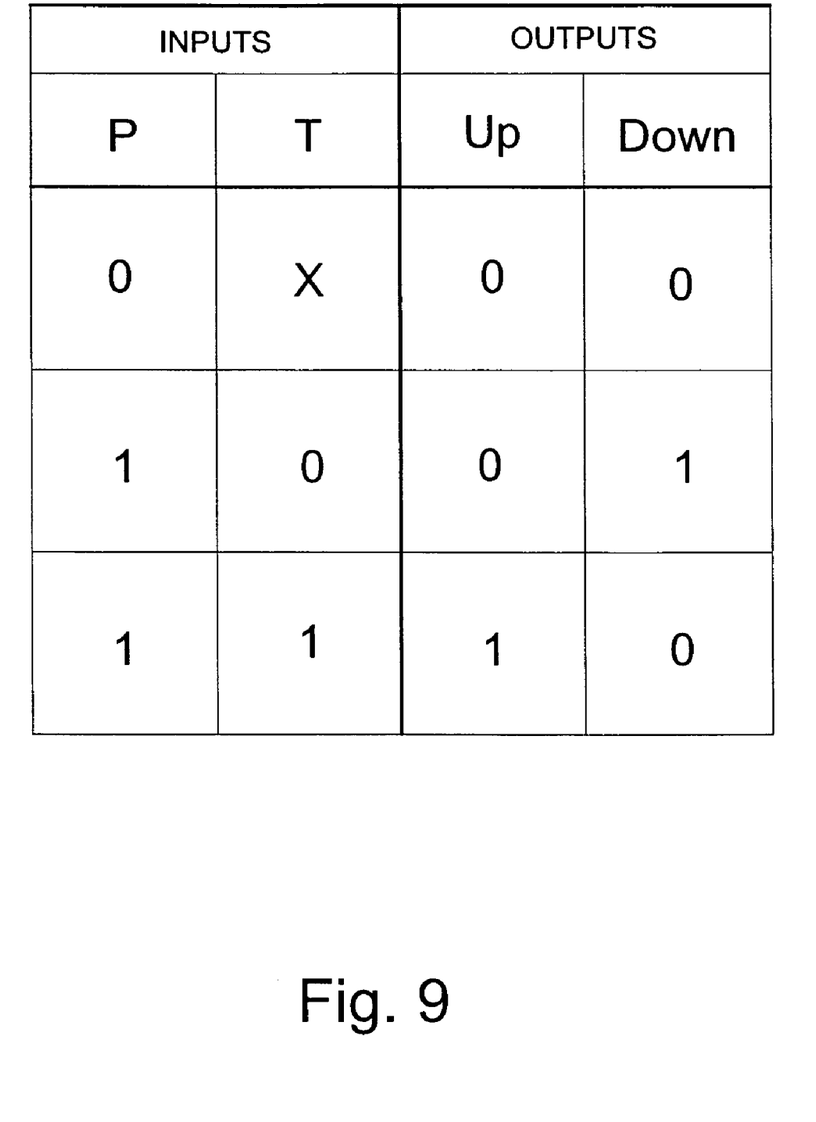
FIG. 9 is a truth table for the phase detector of FIG. 7, in accordance with one embodiment of the present invention.

Referring now to FIG. 9, a truth table for the up/down selector circuit of the FIG. 7 phase detector 512 is shown, in accordance with one embodiment of the present invention. The FIG. 9 truth table is presented to illustrate the operation of the FIG. 7 embodiment of phase detector 512. In alternate embodiments, phase detector 512 may be implemented according to truth tables with input and/or output values that are different from certain of those input and output values discussed in conjunction with the FIG. 9 embodiment.

In the FIG. 9 truth table, an input section shows a signal P 760 and a signal T 740 (see FIG. 7) that are provided to gate B 764 and gate C 768. The FIG. 9 truth table also shows an output section for up signal 516(a) and down signal 516(b). According to the FIG. 9 truth table, when signal P 760 is zero (indicating no data transitions in input data 214), then both up signal 516(a) and down signal 516(b) are in a tristate condition with an output of zero that indicates no adjustment of the frequency of VCO 528 of PLL 218. However, when signal P 760 is high, and signal T 740 is low, then down signal 516(b) is activated. Conversely, when signal P is high, and signal T is high, then up signal 516(a) is activated. For at least the foregoing reasons, the present invention therefore provides an improved system and method for effectively implementing a phase detector to perform a data transmission procedure.

The invention has been explained above with reference to certain embodiments. Other embodiments will be apparent to those skilled in the art in light of this disclosure. For example, the present invention may readily be implemented using configurations and techniques other than those described in the embodiments above. Additionally, the present invention may effectively be used in conjunction with systems other than those described above. Therefore, these and other variations upon the discussed embodiments are intended to be covered by the present invention, which is limited only by the appended claims.

What is claimed is:

1. A phase detector for use in a data transmission procedure, comprising:
    a lead/lag indicator circuit that generates a lead/lag indicator signal T to indicate whether a clock signal received through a feedback loop is early or late with respect to input data; and
    a positive-edge detector circuit that generates an edge detection signal P to indicate whether data transitions are present in said input data, said phase detector generating a binary clock-control output signal corresponding to a current state of said lead/lag indicator signal T if said edge detection signal P is active, said binary clock-control output signal being filtered and applied directly to a clock generator device for adjusting said clock signal.

2. The phase detector of claim 1 wherein said phase detector generates said binary clock-control output signal as a tristate output signal that does not adjust said clock signal whenever data transitions are not present in said input data.

3. The phase detector of claim 1 wherein said phase detector further comprises an input circuit that receives said input data from a data source.

4. The phase detector of claim 1 wherein said phase detector is implemented in a phase-locked loop that includes said clock generator device implemented as a voltage-controlled oscillator that outputs said clock signal for timing said input data through a receiver device, said clock signal also being provided to a clock input of said phase detector via said feedback loop, said phase detector comparing said clock signal and said input data to generate said binary clock-control signal implemented as a phase error signal that represents a current phase relationship between said clock signal and said input data, said phase error signal adjusting a current frequency of said clock signal from said voltage-controlled oscillator.

5. The phase detector of claim 1 wherein said phase detector is implemented in a delay-locked loop that includes said clock generator device implemented as a delay line that outputs said clock signal for timing said input data through a receiver device, said clock signal also being provided to a clock input of said phase detector via said feedback loop, said phase detector comparing said clock signal and said input data to generate said binary clock-control signal implemented as a phase error signal that represents a current phase relationship between said clock signal and said input data, said phase error signal adjusting a current phase of said clock signal from said delay line.

6. The phase detector of claim 1 wherein said phase detector further comprises an up/down selector circuit that alternately generates said binary clock-control signal implemented as either an up signal or a down signal as said binary clock-control output signal depending upon whether said clock signal is early or late with respect to said input data.

7. The phase detector of claim 6 wherein said up/down selector circuit has three output states including an active up state that increases a current frequency of said clock signal, an active down state that decreases said current frequency of said clock signal, and a tristate output state that has no effect upon said clock signal.

8. The phase detector of claim 1 wherein said phase detector utilizes said lead/lag indicator signal T as a polarity signal to indicate a clock phase adjustment polarity for said clock signal, said phase detector utilizing said edge detection signal P as an enable signal to enable adjusting said clock signal only when said data transitions are present in said input data.

9. The phase detector of claim 1 wherein said phase detector aligns a negative edge of said clock signal with said data transitions of said input data so that a positive edge of said clock signal optimally aligns data capture points away from said data transitions of said input data.

10. The phase detector of claim 1 wherein said lead/lag indicator signal T is low when said clock signal leads said input data, said lead/lag indicator signal T being high when said clock signal lags said input data, said phase detector outputting an active up signal when said edge detection signal P is active and said lead/lag indicator signal T is high, said phase detector outputting an active down signal when said edge detection signal P is active and said lead/lag indicator signal T is low.

11. A phase detector for use in a data transmission procedure, comprising:
    a lead/lag indicator circuit that generates a lead/lag indicator signal T to indicate whether a clock signal received through a feedback loop is early or late with respect to input data; and
    a positive-edge detector circuit that generates an edge detection signal P to indicate whether data transitions are present in said input data, said phase detector generating a binary clock-control output signal corresponding to a current state of said lead/lag indicator signal T if said edge detection signal P is active, said binary clock-control output signal being filtered and applied directly to a clock generator device for adjusting said clock signal, said phase detector including an input circuit, said lead/lag indicator circuit, said positive-edge detector circuit, and an up/down selector circuit, said input circuit including a D flip-flop A, a first inverter, and a D flip-flop B, said first inverter being connected to a clock input of said D flip-flop B, said lead/lag indicator circuit including a D flip-flop D with a data input connected to an output of said D flip-flop B said lead/lag indicator circuit also including a clock input connected to an output of said D flip-flop A, said positive-edge detector circuit including a D flip-flop C with a data input connected to an output of said D flip-flop A, said positive-edge detector circuit also including a second inverter positioned between an output of said D flip-flop C and a first input of an edge-detector gate A, said up/down selector circuit including an up gate B with a first input connected to an output of said edge-detector gate A, a third inverter, and a down gate C with a first input connected to said output of said edge-detector gate A, said third inverter being positioned between an output of said D flip-flop D and a second input of said down gate C.

12. The phase detector of claim 11 wherein said input data is provided to said D flip-flop A and said D flip-flop B, said clock signal being provided to said D flip-flop A, said clock signal also being inverted by said first inverter and then provided to said D flip-flop B, said D flip-flop A generating a retimed data signal B, said D flip-flop B generating a retimed data signal C.

13. The phase detector of claim 12 wherein said retimed data signal C is provided to said data input of said D flip-flop D, said retimed data signal B being provided to a clock input of said D flip-flop D to output said lead/lag indicator signal T that indicates a current clock-early/clock-late phase relationship between said input data and said clock signal.

14. The phase detector of claim 13 wherein said retimed data signal B is provided to said data input of said D flip-flop C, said clock signal being provided to said D flip-flop C to output a delay signal A that is then inverted by said second inverter before being applied to a first input of said edge-detector gate A, said retimed data signal B also being provided to a second input of said edge-detector gate A to output said edge detection signal P that indicates whether said data transitions are present in said input data.

15. The phase detector of claim 14 wherein said edge detection signal P is applied both to a first input of said up gate B, and to a first input of said down gate C, said lead/lag indicator signal T being provided to a second input of said up gate B to generate an up signal for increasing a current frequency of said clock signal, said lead/lag indicator signal T also being inverted by said third inverter, and provided to a second input of said down gate C to output a down signal for decreasing said current frequency of said clock signal.

16. The phase detector of claim 15 wherein said up signal and said down signal are formed of stable pulses because only said delay signal A and said retimed data signal B are evaluated by edge detector gate A to generate said edge detection signal P.

17. The phase detector of claim 11 wherein said edge detector gate A, said up gate B, and said down gate C are implemented as AND gates that have matching symmetrical output data paths for all inputs.

18. The phase detector of claim 11 wherein said edge detector gate A detects only positive edges in said input data to avoid negative-edge detection errors due to varying pulse widths in said input data.

19. The phase detector of claim 11 wherein said edge detector gate A is implemented as an AND gate instead of an EXCLUSIVE-OR gate to conserve operating power and to provide a less complicated and costly gate architecture.

20. The phase detector of claim 11 wherein said retimed data signal B from said D flip-flop A of said input circuit of said phase detector is utilized as a receiver output without required a separate data sampler circuit to generate said receiver output.

21. A method for utilizing a phase detector to support a data transmission procedure, comprising:
generating a lead/lag indicator signal T from a lead/lag indicator circuit to indicate whether a clock signal received through a feedback loop is early or late with respect to input data; and
generating an edge detection signal P from a positive-edge detector circuit to indicate whether data transitions are present in said input data, said phase detector generating a binary clock-control output signal corresponding to a current state of said lead/lag indicator signal T if said edge detection signal P is active, said binary clock-control output signal being filtered and applied directly to a clock generator device for adjusting said clock signal.

* * * * *